United States Patent
Inaba (10) Patent No.: US 6,300,197 B1
(45) Date of Patent: Oct. 9, 2001

(54) METHOD OF FABRICATING SEMICONDUCTOR DEVICE

(75) Inventor: Satoshi Inaba, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/089,148

(22) Filed: Jun. 2, 1998

(30) Foreign Application Priority Data

Jun. 3, 1997 (JP) .................................................... 9-145258

(51) Int. Cl.[7] .................. H01L 21/36; H01L 21/8242; H01L 29/76; H01L 29/788
(52) U.S. Cl. .................. 438/258; 438/259; 438/264; 257/314; 257/315; 257/318
(58) Field of Search ............................ 438/259, 258, 438/264; 257/314, 315, 316, 318

(56) References Cited

U.S. PATENT DOCUMENTS

| | | | |
|---|---|---|---|
| 4,627,153 | * 12/1986 | Masuoka | 29/571 |
| 4,651,406 | * 3/1987 | Shimizu et al. | 29/571 |
| 4,675,982 | * 6/1987 | Noble, Jr. et al. | 29/576 |
| 4,957,878 | * 9/1990 | Lowery et al. | 437/52 |
| 5,057,449 | * 10/1991 | Lowery et al. | 437/60 |
| 5,089,862 | * 2/1992 | Warner, Jr. et al. | 357/23.1 |
| 5,155,056 | * 10/1992 | Jeong-Gyoo | 437/47 |
| 5,254,489 | * 10/1993 | Nakata | 437/40 |
| 5,384,477 | * 1/1995 | Bulucea et al. | 257/372 |
| 5,502,009 | * 3/1996 | Lin | 437/239 |
| 5,942,780 | * 8/1999 | Barsan et al. | 257/321 |

* cited by examiner

Primary Examiner—Olik Chaudhuri
Assistant Examiner—Shrinivaj H Rao
(74) Attorney, Agent, or Firm—Pillsbury Madison & Sutro LLP

(57) ABSTRACT

In a method of manufacturing a semiconductor device having MIS field effect transistors (MIS-FETs) with gate insulating films of two or more different film thicknesses formed on the same silicon semiconductor substrate, first, impurity for enhancing the growth rate of a gate insulating film is selectively doped into an element region on which the gate insulating film is to be formed thick and which is contained in element regions in which the MIS-FETs are to be formed. On the other hand, impurity for lowering the growth rate of a gate insulating film is selectively doped into an element region on which the gate insulating film is to be formed thin and which is contained in the element regions in which the MIS-FETs are to be formed. Next, gate insulating films are formed on the respective element regions by use of the anodic oxidation method or the like. As a result, the number of photography steps for forming mask patterns can be reduced, the heat treatment for formation of the gate insulating films can be alleviated, the manufacturing efficiency can be enhanced and the manufacturing cost can be lowered.

18 Claims, 6 Drawing Sheets

METHOD OF FABRICATING SEMICONDUCTOR DEVICE

BACKGROUND OF THE INVENTION

The present invention relates to a method of manufacturing a semiconductor device having MIS (Metal Insulator Semiconductor) field effect transistors (MIS-FETs), and more particularly to a method of manufacturing a semiconductor device including MIS-FETs having gate insulating films with two or more different substrate.

As semiconductor devices having MIS field effect transistors (MIS-FETs) or MOS-FETs which are typical examples thereof, a memory device such as a dynamic RAM or static RAM and an operation device using a CMOS logic circuit are provided.

At present, miniaturization of elements due to enhancement of the integration density and enhancement of the performance cannot be avoided. In order to maintain the reliability of the elements and prevent an increase in the power consumption due to an increase in the number of the elements, it becomes inevitable to lower the power supply voltage of an internal circuit in which the elements are formed.

On the other hand, in a circuit portion having an interface with the exterior, that is, in a peripheral circuit, it is necessary to take over the specification of the power supply voltage of a circuit in the exterior conventionally used even if the generations are changed and it cannot be easily changed. That is, the peripheral circuit of the interface portion in the semiconductor device is required to be operated on a voltage higher than the power supply voltage for operating the above internal circuit. Therefore, it is required to use a plurality of power supply voltages in one semiconductor device.

In order to maintain the reliability of the operation of the elements for the plurality of power supply voltages, MIS-FETs are required to be formed such that the thickness of the gate insulating film thereof will be made relatively thin for the element which is operated on a low voltage and relatively thick for the element which is operated on a high voltage. For example, in order to simultaneously attain the 3.3 V operation and 2.5 V operation, silicon oxide films with film thicknesses of approx. 9 nm and 6 nm are required.

In order to attain this, conventionally, a silicon nitride film is used as a protection film against oxidation and a portion in which a thin silicon oxide film is formed and a portion in which a thick silicon oxide film is formed are separately oxidized.

Figure 1:
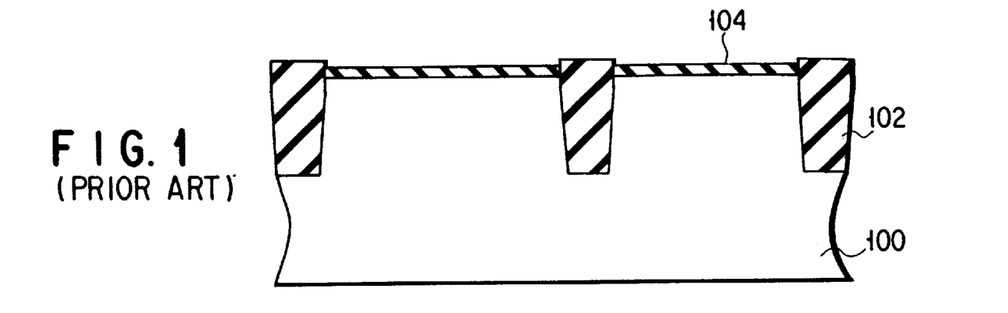
FIG. 1 is a cross sectional view for illustrating an example of a conventional manufacturing method in a case where silicon oxide films of two different film thicknesses are formed.
Figure 2A:
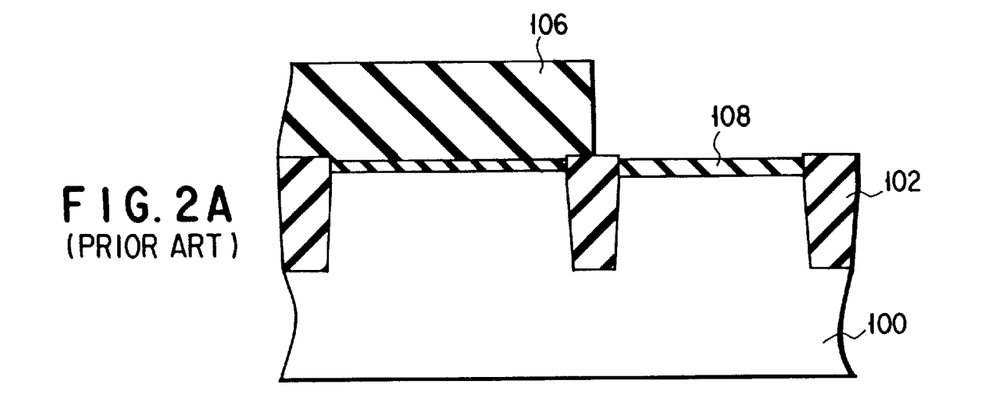
FIGS. 2A and 2B are cross sectional views for illustrating the example of the conventional manufacturing method in a case where the silicon oxide films of two different film thicknesses are formed.
Figure 2B:
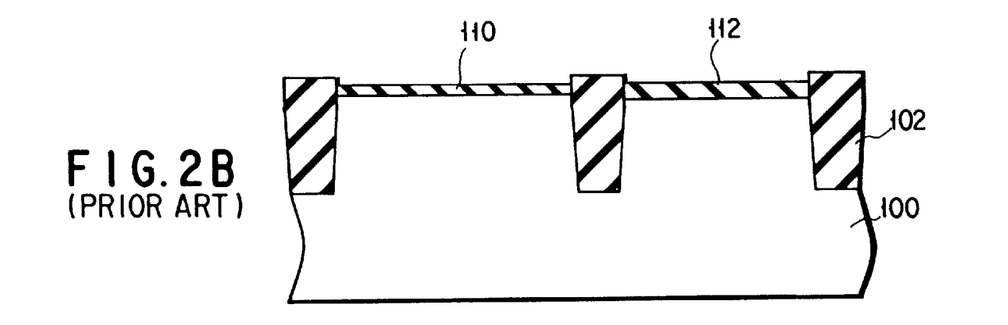
Figure 3:
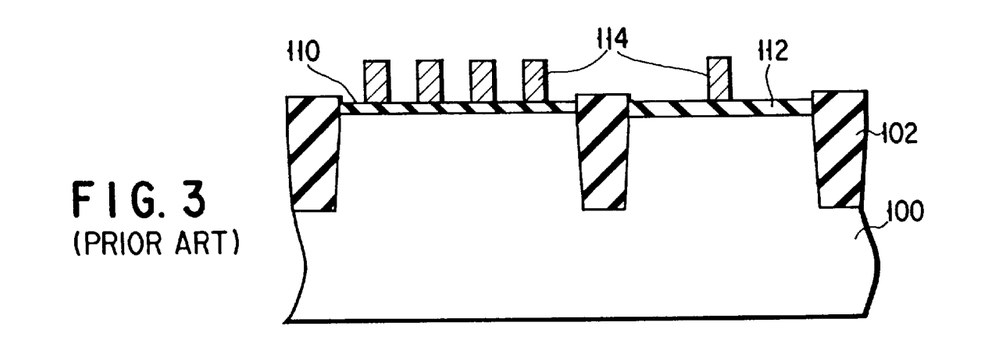
FIG. 3 is a cross sectional view for illustrating the example of the conventional manufacturing method in a case where the silicon oxide films of two different film thicknesses are formed.

FIGS. 1 to 3 are cross sectional views for illustrating one example of a conventional manufacturing method wherein silicon oxide films with two different film thicknesses as described above are formed.

As shown in FIG. 1, an element isolation region 102 is formed on a semiconductor substrate 100 to define an element region and then the channel ion-implantation is effected after a buffer oxide film 104 is formed on the semiconductor substrate 100. In the channel ion-implantation, since the power supply voltages used for the internal circuit and the peripheral circuit are different, it is necessary to separately form openings in a portion in which a thin silicon oxide film is formed and a portion in which a thick silicon oxide film and then effect the ion-implantation in order to suppress the short channel effect and adjust the threshold voltages.

In this case, it is assumed that the left element region defined by the element isolation region 102 is used for forming elements having a thin silicon oxide film and the right element region is used for forming elements having a thick silicon oxide film.

After a silicon nitride film is formed on the buffer oxide film 104, the silicon nitride film in a region where the thick silicon oxide film (on the right side) is to be formed is removed and a silicon nitride film pattern 106 is formed only in a region where the thin silicon oxide film (on the left side) is to be formed as shown in FIG. 2A. After this, the buffer oxide film 104 is removed only in a region where the thick silicon oxide film (on the right side) is to be formed and first oxidation is effected by use of the thermal oxidation method to form a silicon oxide film (thermal oxidation film) 108 in the region where the thick silicon oxide film (on the right side) is to be formed. In the step of forming the silicon oxide film 108, a silicon oxide film with a thickness obtained by adding a difference in the film thickness between the thin silicon oxide film and the thick silicon oxide film to a film thickness removed by etching of the buffer oxide film 104 in the region where the thin silicon oxide film (on the left side) is to be formed is formed.

Next, as shown in FIG. 2B, the silicon nitride film 106 in the region where the thin silicon oxide film (on the left side) is to be formed is removed by use of a phosphorus acid solution or the like and then the buffer oxide film 104 is etched. After this, second oxidation is effected by the thermal oxidation method to form silicon oxide films (gate oxide films) 110, 112 of two different film thicknesses, that is, silicon oxide films having a desired difference in the film thickness in the right and left regions. After this, as shown in FIG. 3, gate electrodes 114 are formed and then the process is effected according to the normal MOS-FET manufacturing process.

However, in the conventional manufacturing method described above, it is necessary to effect the cleaning step for the wafer in each of the two oxidation steps and enhance the heat treatment in view of the margin of etching of the buffer oxide film. Thus, there is a problem that the process becomes complicated and the number of heat treatments and time for the heat treatment are increased.

BRIEF SUMMARY OF THE INVENTION

Accordingly, it is an object of the present invention to provide a method of manufacturing a semiconductor device including MIS-FETs having gate insulating films with different film thicknesses on the same semiconductor substrate wherein the manufacturing efficiency is enhanced and the manufacturing cost is lowered by reducing the number of photolithography steps for formation of mask patterns and alleviating the heat treatment process for formation of gate insulating films.

According to one aspect of the present invention, there is provided a method of manufacturing a semiconductor device having MIS field effect transistors (MIS-FETs) with gate insulating films of different film thicknesses formed on the same semiconductor substrate, comprising the steps of: effecting channel ion-implantation with respect to at least one of element regions in which the MIS-FETs are to be formed; selectively doping impurity for substantially changing the growth rate of an insulating film into the at least one of the element regions; and forming a gate insulating film on the element region which has been subjected to the channel ion-implantation and the doping of impurity.

According to another aspect of the present invention, there is provided a method of manufacturing a semiconductor device having a first MIS-FET with a gate insulating film of first film thickness and a second MIS-FET with a gate insulating film of second film thickness larger than the first film thickness formed on the same semiconductor substrate, comprising the steps of: effecting channel ion-implantation for an element region in which the first MIS-FET is to be formed and the doping of impurity for lowering the growth rate of the gate insulating film with the first film thickness, by use of a first mask pattern; effecting channel ion-implantation for an element region in which the second MIS-FET is to be formed, by use of a second mask pattern; and forming gate insulating films on the respective element regions which have been subjected to the channel ion-implantation and the doping of the impurity.

According to another aspect of the present invention, there is provided a method of manufacturing a semiconductor device having a first MIS-FET with a gate insulating film of first film thickness and a second MIS-FET with a gate insulating film of second film thickness larger than the first film thickness formed on the same semiconductor substrate, comprising the steps of: effecting channel ion-implantation for an element region in which the first MIS-FET is to be formed, by use of a first mask pattern; effecting channel ion-implantation for an element region in which the second MIS-FET is to be formed and the doping of impurity for enhancing the growth rate of the gate insulating film with the second film thickness, by use of a second mask pattern; and forming gate insulating films on the respective element regions which have been subjected to the channel ion-implantation and the doping of the impurity.

According to another aspect of the present invention, there is provided a method of manufacturing a semiconductor device having a first MIS-FET with a gate insulating film of first film thickness and a second MIS-FET with a gate insulating film of second film thickness larger than the first film thickness formed on the same semiconductor substrate, comprising the steps of: effecting channel ion-implantation for an element region in which the first MIS-FET is to be formed and the doping of impurity for lowering the growth rate of the gate insulating film with the first film thickness, by use of a first mask pattern; effecting channel ion-implantation for an element region in which the second MIS-FET is to be formed and the doping of impurity for enhancing the growth rate of the gate insulating film with the second film thickness, by use of a second mask pattern; and forming gate insulating films on the respective element regions which have been subjected to the channel ion-implantation and the doping of the impurities.

According to another aspect of the present invention, there is provided a method of manufacturing a semiconductor device having MIS field effect transistors (MIS-FETs) with gate insulating films of different film thicknesses formed on the same semiconductor substrate, comprising the steps of: selectively doping impurity into an element region in which the gate insulating film is to be formed thick and which is contained in element regions in which the MIS-FETs are to be formed or an element region in which the gate insulating film is to be formed thin and which is contained in the element regions in which the MIS-FETs are to be formed; and forming a gate insulating film on the respective element regions which have been doped with the impurity, by use of an anodic oxidation method.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A first embodiment of the present invention is explained.

The first embodiment is a method of manufacturing a semiconductor device in which silicon oxide films with two or more different film thicknesses by use of the thermal oxidation method and FIGS. 4A to 6 are cross sectional views for illustrating the method of manufacturing the semiconductor device.

Figure 4A:
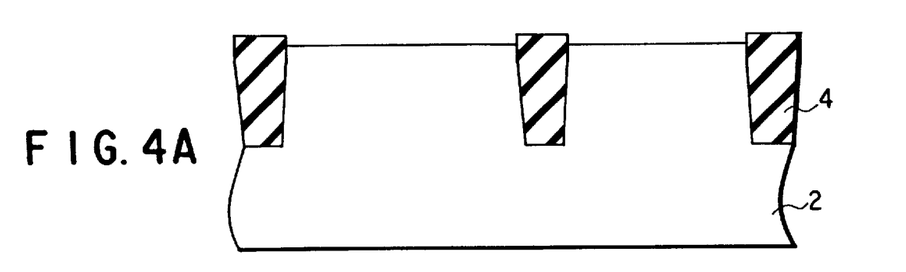
FIGS. 4A and 4B are cross sectional views for illustrating a method of manufacturing a semiconductor device according to a first embodiment.

As shown in FIG. 4A, a field oxide film 4 used as an element isolation region is formed on a semiconductor substrate 2. In this case, an example using the STI (Shallow Trench Isolation) technique is shown, but the element isolation region may be formed by use of the LOCOS (Local Oxidation of Silicon) method which is conventionally used. Although not shown in the drawing, after a buffer oxide film 6 used for the well ion-implantation and channel ion-implantation is formed, a well for n-type MOS-FETs is formed. For example, boron (B) is ion-implanted into the n-type MOS-FET region with the dose amount of approx. $2 \times 10^{13}$ $[cm^{-2}]$. In this example, it is assumed that n-type MOS-FETs are formed in both of the right and left regions defined by the field oxide film 4, but it is possible to form p-type MOS-FETs. If a well for the p-type MOS-FETs is formed, for example, phosphorus (P) is ion-implanted into the n-type MOS-FET region with the dose amount of approx. $2 \times 10^{13}$ $[cm^{-2}]$.

Further, it is assumed that the internal circuit is to be formed in the left element region and a silicon oxide film used as a gate insulating film with a small film thickness, for example, 6 nm is formed. On the other hand, it is assumed that the peripheral circuit used as an interface with the exterior is formed in the right element region and a silicon oxide film used as a gate insulating film having a film thickness which is larger than that of the internal circuit formed in the left element region, for example, 9 nm is formed.

Figure 4B:
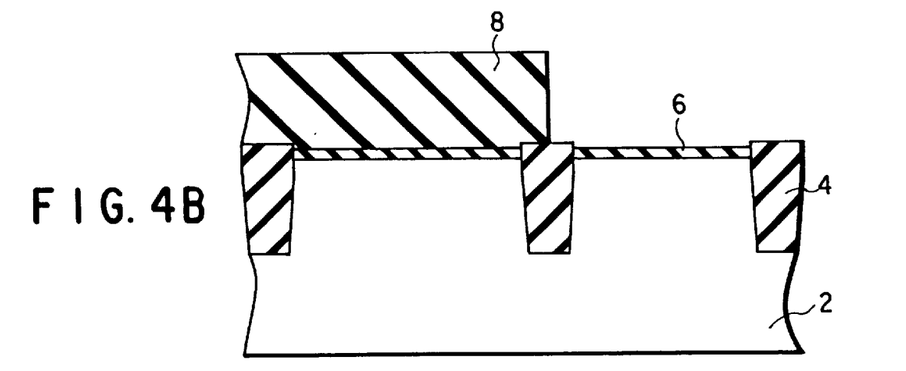

Since the power supply voltages used for the internal circuit and the peripheral circuit are different, it becomes necessary to form openings in the right and left element regions and effect the ion-implantation in the channel ion-implantation process in order to suppress the short channel effect and adjust the threshold voltages. Therefore, as shown in FIG. 4B, a resist film is patterned by the photolithography technology to remove the resist film on the right element region and form a resist pattern 8 only on the left element region. Next, the channel ion-implantation for giving a predetermined element characteristic to the peripheral circuit is effected in the right element region having the opening, that is, the region in which the peripheral circuit is to be formed. In the channel ion-implantation, boron (B) is ion-implanted with the dose amount of approx. $1.5 \times 10^{13}$ $[cm^{-2}]$. In the case of the p-type MOS-FET, for example, phosphorus (P) is ion-implanted with the dose amount of approx. $1.5 \times 10^{13}$ $[cm^{-2}]$.

Further, since the right element region is a region in which the gate insulating film or silicon oxide film is desired to be formed with a larger film thickness, ions of an element such as argon (Ar), xenon (Xe) or oxygen ($O_2$) for enhancing the growth rate of the silicon oxide film are doped into the surface area of the semiconductor substrate 2 of the right element region with the resist pattern 8 used as a mask so that the peak of the impurity distribution will be set near the surface of the substrate. At this time, it is known that the growth rate by oxidation becomes approx. 1.5 to 3 times that in a case wherein no ions are doped when a thin silicon oxide film of approx. 10 nm is formed if the dose amount is set to approx. $1.0 \times 10^{15}$ $[cm^{-2}]$ to approx. $1.0 \times 10^{16}$ $[cm^{-2}]$.

Figure 5A:
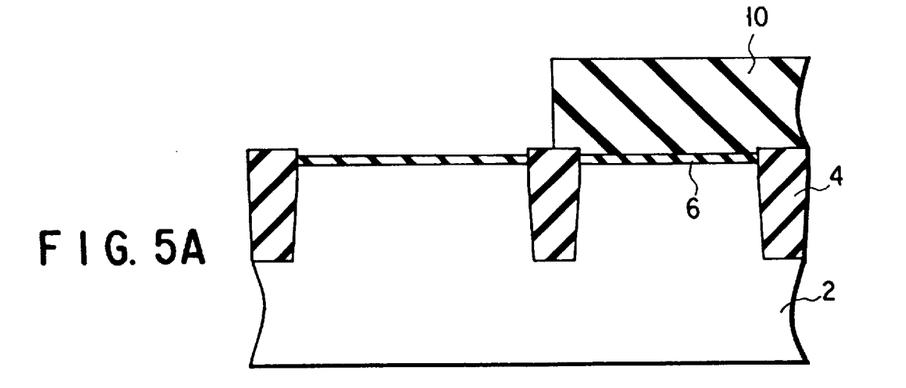
FIGS. 5A and 5B are cross sectional views for illustrating the method of manufacturing the semiconductor device according to the first embodiment.

After the resist pattern 8 is etched, a resist film is coated and patterned by the photolithography technology again as shown in FIG. 5A, the resist film on the left region is removed and a resist pattern 10 is thus formed only on the right element region. Next, the channel ion-implantation for giving a predetermined element characteristic to the internal circuit is effected in the left element region having the opening, that is, in the region in which the internal circuit is to be formed. In the channel ion-implantation, boron (B) is ion-implanted with the dose amount of approx. $2.0 \times 10^{13}$ $[cm^{-2}]$. In the case of p-type MOS-FET, for example, phosphorus (P) is ion-implanted with the dose amount of approx. $2.0 \times 10^{13}$ $[cm^{-2}]$.

Figure 5B:
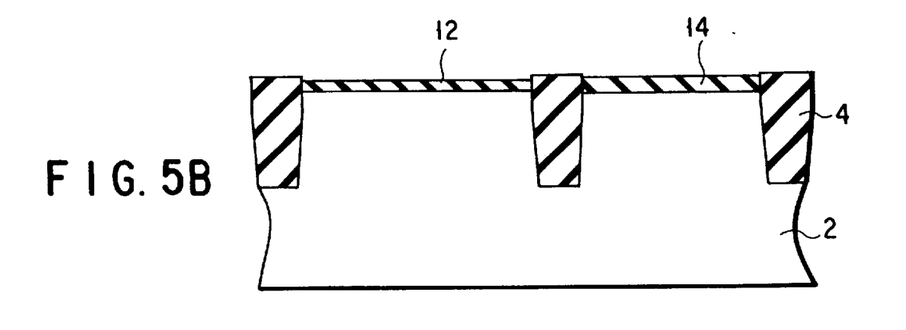

Next, the resist pattern 10 on the right element region is etched and the buffer oxide films 6 on both of the right and left element regions are removed. Further, as shown in FIG. 5B, a silicon oxide film with a film thickness of 6 nm is formed by the thermal oxidation method and used as a gate insulating film 12 in the left element region in which the internal circuit is to be formed. At the same time, a silicon oxide film with a film thickness of 9 nm is formed and used as a gate insulating film 14 in the right element region in which the peripheral circuit is to be formed.

At this time, as described before, since the element ions for enhancing the growth rate of the silicon oxide film are doped in the surface area in the right element region in which the peripheral circuit is to be formed, the gate insulating films 12 and 14 with the film thicknesses of 6 nm and 9 nm can be simultaneously formed on the left and right regions by adjusting the dose amount of the element ions doped into the right element region and setting the growth rate in the right element region to 1.5 times that in the left element region. The dose amount of the element ions doped is approx. $1.0 \times 10^{15}$ $[cm^{-2}]$.

In this example, the element ions for enhancing the growth rate of the silicon oxide film are doped into the right element region in which the peripheral circuit is to be formed, but this is not limitative, and the growth rate of the silicon oxide film in the right element region can be set to 1.5 times that in the left element region by doping element ions for enhancing the growth rate of the silicon oxide film into the right element region, and at the same time, doping element ions for lowering the growth rate into the left element region.

In this case, after the channel ion-implantation is effected in the step of FIG. 4B of this embodiment, ions of an element such as Ar, Xe or $O_2$ for enhancing the growth rate of the silicon oxide film are doped into the surface area of the semiconductor substrate 2 of the right element region with the dose amount of $1.0 \times 10^{15}$ $[cm^{-2}]$ or less with the resist pattern 8 used as a mask. Further, after the channel ion-implantation is effected in the step shown in FIG. 5A, ions of an element such as nitrogen ($N_2$) for lowering the growth rate of the silicon oxide film are doped into the surface area of the semiconductor substrate 2 of the left element region with the dose amount of $1.0 \times 10^{15}$ $[cm^{-2}]$ or less with the resist pattern 10 used as a mask so that the peak of the impurity distribution will be set near the surface of the substrate. Thus, even if the dose amount is as small as $1.0 \times 10^{15}$ $[cm^{-2}]$ or less, the gate insulating films 12 and 14 with the film thicknesses of 6 nm and 9 nm can be simultaneously formed on the left and right regions by adjusting the dose amounts of element ions doped into the right and left element regions and setting the growth rate in the right element region to 1.5 times that in the left element region.

Further, as another method, it is possible to set the growth rate of the silicon oxide film in the right region to 1.5 times that in the left region by doping element ions for lowering the growth rate of the silicon oxide film only into the left element region in which the internal circuit is to be formed. In this case, after the channel ion-implantation is effected in the step shown in FIG. 4B of this embodiment, the channel ion-implantation is effected in the step shown in FIG. 5A without doping element ions for enhancing the growth rate of the silicon oxide film and then ions of an element such as $N_2$ for lowering the growth rate of the silicon oxide film are doped into the surface area of the semiconductor substrate 2 of the left element region with the dose amount of approx. $1.0 \times 10^{16}$ [$cm^{-2}$] with the resist pattern 10 used as a mask.

Figure 6:
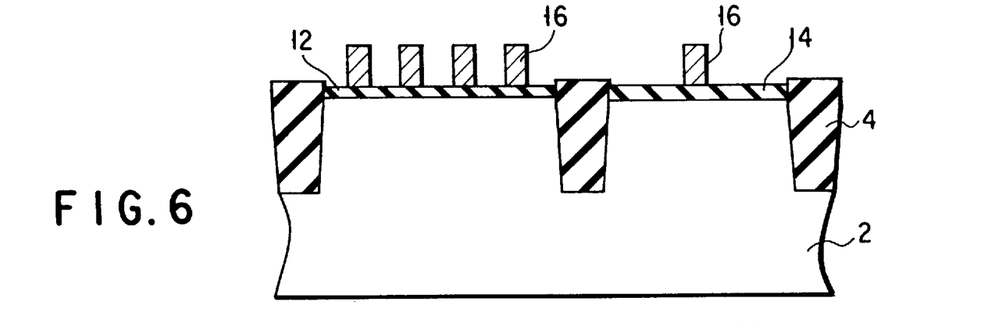
FIG. 6 is a cross sectional view for illustrating the method of manufacturing the semiconductor device according to the first embodiment.

After this, as shown in FIG. 6, a polysilicon film adequately doped with impurity is deposited and the polysilicon film is patterned by the photolithography technology to form gate electrodes 16 on both of the element regions. After this, the process is effected according to the normal MOS-FET manufacturing process.

As described above, according to the first embodiment, by successively effecting the channel ion-implantation and the ion-implantation for changing the growth rate of the silicon oxide film by use of the same mask pattern, the number of photolithography steps for formation of the resist pattern may be reduced in comparison with the conventional complicated process and silicon oxide films with two different film thicknesses can be formed by one thermal oxidation process. In this case, it is possible to form silicon oxide films having a film thickness ratio of approx. 1.0 to 3.0.

[Second Embodiment]

Next, a second embodiment of the present invention is explained.

The second embodiment relates to a method of manufacturing a semiconductor device for forming silicon oxide films with two or more different film thicknesses by use of the anodic oxidation method which is an electrochemical oxidation method. It is known that the silicon oxide film can be formed based on the following chemical reaction formula in the anodic oxidation method.

$$Si+2H_2O+4p^+ \rightarrow SiO_2+4H^+$$

Therefore, in this embodiment, the fact that the semiconductor substrate is not oxidized or the oxidation speed is extremely made low when no holes $p^+$ are supplied is utilized. In order to serve the above purpose, it is considered to supply no holes $p^+$ from the front and rear surfaces of the semiconductor substrate. That is, impurity is doped into a region in which the oxidation speed is desired to be lowered so as to change the region into an n-type region and a condition of a dark atmosphere in which no light is applied is set up so that the concentration of holes which are the minority carriers will be made low at the time of anodic oxidation. The normal anodic oxidation method is effected by applying a sufficient amount of light to the n-type region to generate holes $p^+$ which are minority carriers.

A silicon oxide film with a film thickness given by adding a film thickness which is determined by taking it into consideration that the oxidation speed for the n-type region is approx. 1.2 times higher than that of the other portion in the anodic oxidation at the time of application of light to a difference in the film thickness between the two types of silicon oxide films which are desired to be formed is formed on a region where the silicon oxide film is desired to be formed thick in the dark atmosphere and then light is sufficiently applied to form a silicon oxide film also on the n-type doped region while minority carriers are generated. The reason why the film thickness which is determined by taking it into consideration that the oxidation speed becomes approx. 1.2 times higher is added is that it is known that the oxidation speed in the n-type region becomes approx. 1.2 times higher at the time of high light intensity, for example, at the time of 5000 Lux or more.

Next, a method of manufacturing a semiconductor device according to the second embodiment is explained with reference to the accompanying drawings. FIGS. 7 to 9B are cross sectional views for illustrating the method of manufacturing the semiconductor device according to the second embodiment. In this embodiment, it is assumed that an n-type MOS-FET is formed.

Figure 7:
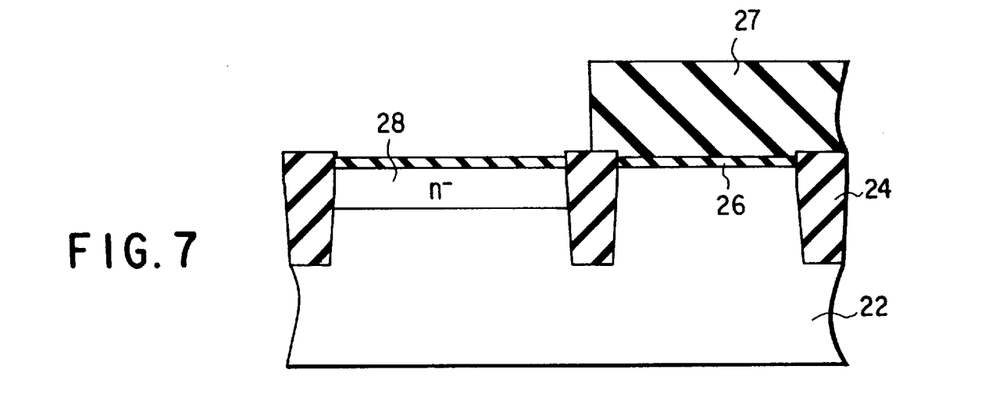
FIG. 7 is a cross sectional view for illustrating a method of manufacturing a semiconductor device according to a second embodiment.

First, as shown in FIG. 7, a field oxide film 24 used as an element isolation region is formed on a p-type semiconductor substrate 22. Next, a buffer oxide film 26 is formed on the entire surface of the p-type semiconductor substrate 22. Like the first embodiment, an example wherein STI is used for formation of the element isolation region is shown, but it is possible to use the LOCOS method which is conventionally used. Further, it is assumed that an internal circuit is to be formed on the left element region and a gate insulating film with a small film thickness, for example, 6 nm is formed. On the other hand, it is assumed that a peripheral circuit used as an interface with the exterior is formed on the right element region and a gate insulating film with a large film thickness, for example, 9 nm which is thicker than that on the left element region is formed.

Next, as shown in FIG. 7, a resist film is patterned by the photolithography technology to remove the resist film on the left element region and form a resist pattern 27 only on the right element region. Next, ions are implanted into the left element region having the opening, that is, a region in which a thin silicon oxide film is to be formed so as to form an n⁻ region 28 in which the hole concentration is made low.

Figure 8A:
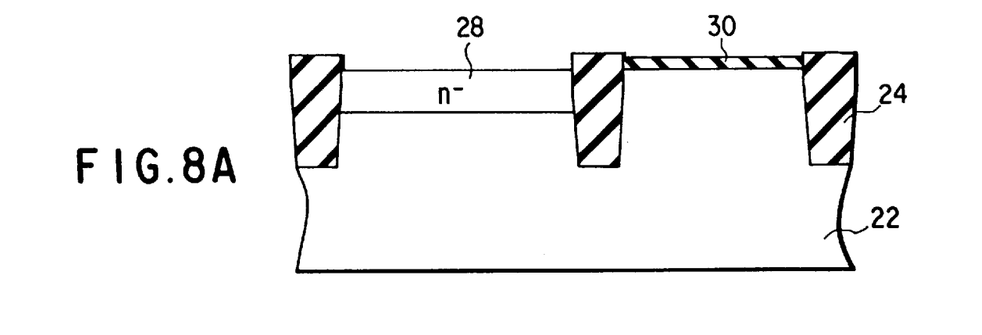
FIGS. 8A and 8B are cross sectional views for illustrating the method of manufacturing the semiconductor device according to the second embodiment.

Next, as shown in FIG. 8A, the resist pattern 27 formed on the right element region is removed and the buffer oxide film 26 formed on the semiconductor substrate 22 is etched. After this, the anodic oxidation is effected in the dark atmosphere without applying light to the semiconductor substrate 22 so as to form a silicon oxide film 30 on the right element region in which the thick silicon oxide film is to be formed. In the anodic oxidation, for example, a wafer containing the semiconductor substrate 22 is dipped together with an electrode into an HCl solution of 0.1 M or a solution of $NH_4OH:H_2O$ of 1:10 and a predetermined current is caused to flow between them to form a silicon oxide film.

At this time, the film thickness of the silicon oxide film 30 formed by the anodic oxidation is set to a film thickness obtained by adding a film thickness which is determined by taking it into consideration that the growth rate of the silicon oxide film is approx. 1.2 times higher in the n-type region (left element region) at the time of application of light to a difference in the film thickness between the thin silicon oxide film formed on the left element region and the thick silicon oxide film formed on the right element region. In the anodic oxidation, it is understood by the recent study that an electrolytic solution of high concentration can be used instead of metal as the contact for the rear surface of the wafer. Therefore, the anodic oxidation can be effected in a clean room without contaminating the wafer with metal.

Figure 8B:
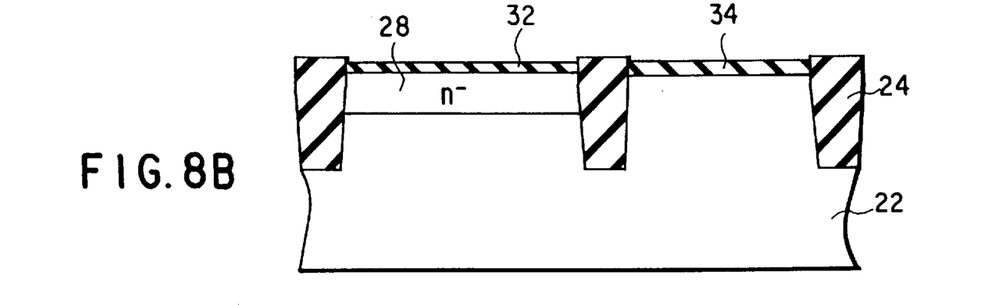

Next, as shown in FIG. 8B, if application of light with the light intensity of 5000 Lux or more, for example, is effected for the semiconductor substrate 22, the growth rate of the silicon oxide film formed on the left element region becomes approx. 1.2 times higher than the growth rate of the silicon oxide film formed on the right element region. By taking this into consideration, the anodic oxidation is effected while the application of light with the light intensity of 5000 Lux or more is being effected and a silicon oxide film with a film thickness of 6 nm is formed on the left element region in which the internal circuit is to be formed and the silicon oxide film is used as a gate insulating film 32. At the same time, a silicon oxide film with a film thickness of 9 nm is formed on the right element region in which the peripheral circuit is to be formed and the silicon oxide film is used as a gate insulating film 34.

Figure 9A:
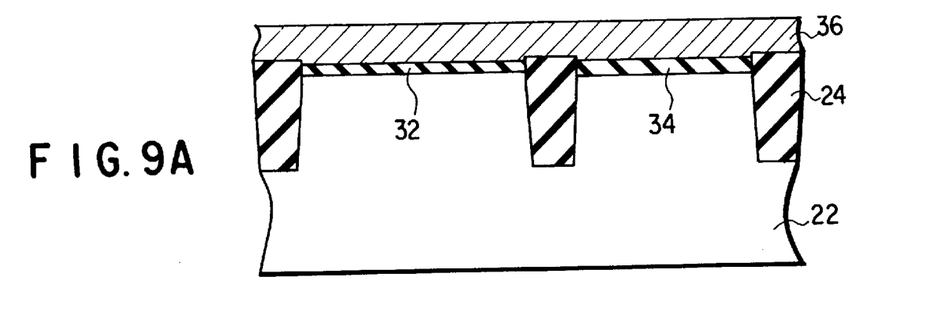
FIGS. 9A and 9B are cross sectional views for illustrating the method of manufacturing the semiconductor device according to the second embodiment.
Figure 9B:
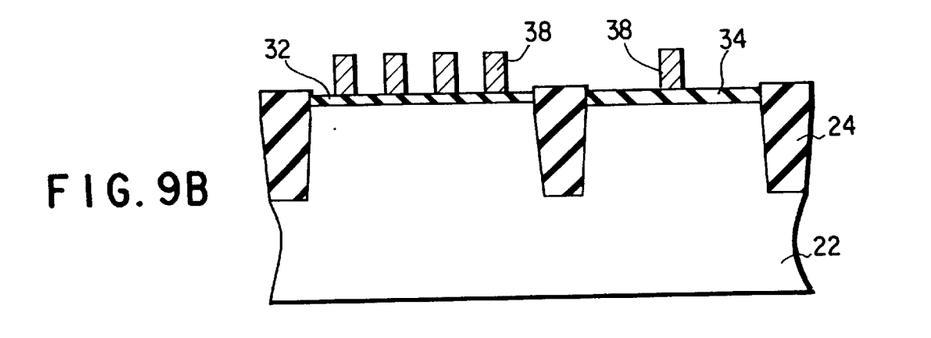

After this, as shown in FIG. 9A, a polysilicon film 36 is deposited, a resist pattern (not shown) is formed on the polysilicon film 36, and impurity is doped into the polysilicon film 36 with the resist pattern used as a mask. Further, by using the same resist pattern as a mask, the well ion-implantation and channel ion-implantation are adequately effected into the semiconductor substrate 22 via the polysilicon film 36. In the above step, the doping into the gate electrode film (polysilicon film 36), well ion-implantation, and channel ion-implantation can be effected by using the same mask and the number of steps can be reduced. Further, as shown in FIG. 9B, the polysilicon film 36 is patterned by the photolithography technology to form gate electrodes 38 on both of the element regions.

After this, like the first embodiment, the process is effected according to the normal MOS-FET manufacturing process. In this embodiment using the anodic oxidation method, the region in which the thin silicon oxide film is to be formed is not necessarily made as the n-type region in the last stage and it is possible to convert the conductivity type thereof by doping impurity into the well or channel portion.

As described above, according to the second embodiment, a region in which the growth rate of the silicon oxide film is desired to be made low is changed to an n-type region by doping and the anodic oxidation in the dark atmosphere and the anodic oxidation at the time of application of light are adequately effected so as to form silicon oxide films with two different film thicknesses while the number of photolithography steps for forming the resist patterns is reduced in comparison with the conventional complicated process. Further, the number of the heat treatment steps effected for the channel impurity doped into the semiconductor substrate can be reduced to a number as small as possible and the elements can be formed with the impurity profile kept steep in the channel region so that the design for the impurity profile can be easily made and the short channel effect can be suppressed.

[Third Embodiment]

Next, a third embodiment of the present invention is explained.

The third embodiment is a modification of the second embodiment and relates to a method of manufacturing a semiconductor device in which silicon oxide films with two or more different film thicknesses are formed by use of the anodic oxidation method and thermal oxidation method.

FIGS. 10A to 12 are cross sectional views for illustrating the method of manufacturing the semiconductor device according to the third embodiment.

Figure 10A:
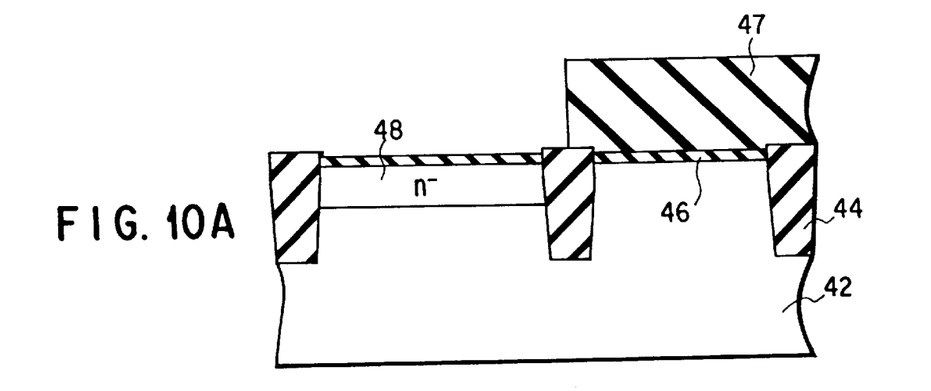
FIGS. 10A and 10B are cross sectional views for illustrating a method of manufacturing a semiconductor device according to a third embodiment.

First, like the second embodiment, as shown in FIG. 10A, a field oxide film 44 used as an element isolation region is formed on a p-type semiconductor substrate 42. Next, a buffer oxide film 46 is formed on the entire surface of the p-type semiconductor substrate 42. Like the above embodiment, an example wherein STI is used for formation of the element isolation region is shown, but it is also possible to use the LOCOS method which is conventionally used. Further, it is assumed that an internal circuit is to be formed on the left element region and a gate insulating film with a small film thickness, for example, 6 nm is formed. On the other hand, it is assumed that a peripheral circuit used as an interface with the exterior is formed on the right element region and a gate insulating film with a large film thickness, for example, 9 nm which is thicker than that on the left element region is formed.

Next, as shown in FIG. 10A, a resist film is patterned by the photolithography technology to remove the resist film on the left element region and form a resist pattern 47 only on the right element region. Next, ions are implanted into the opened left element region, that is, a region in which a thin silicon oxide film is desired to be formed so as to form an n⁻ region 48 in which the hole concentration is made low.

Figure 10B:
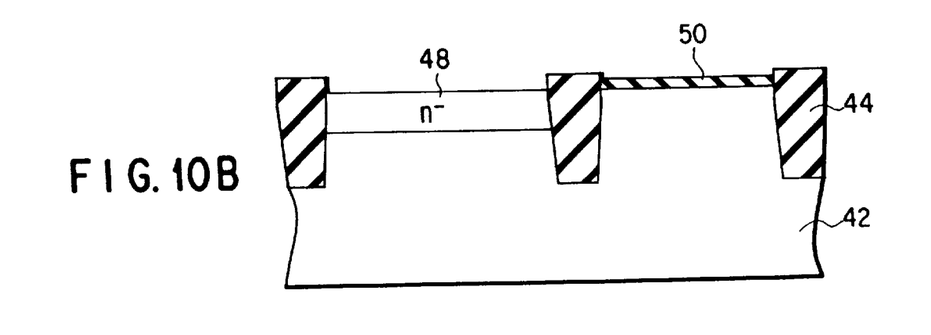

Next, as shown in FIG. 10B, the resist pattern 47 formed on the right element region is removed and the buffer oxide film 46 formed on the semiconductor substrate 42 is etched. After this, the anodic oxidation is effected in the dark atmosphere without applying light to the semiconductor substrate 42 to form a silicon oxide film 50 on the right element region in which the thick silicon oxide film is to be formed. In the anodic oxidation, for example, a wafer containing the semiconductor substrate 42 is dipped together with an electrode into an HCl solution of 0.1 M or a solution of $NH_4OH:H_2O$ of 1:10 and a predetermined current is caused to flow between them so as to form a silicon oxide film. At this time, the film thickness of the silicon oxide film 50 formed by the anodic oxidation is set to a difference in the film thickness between the thin silicon oxide film formed on the left element region and the thick silicon oxide film formed on the right element region, and is 3 nm in this example.

Figure 11A:
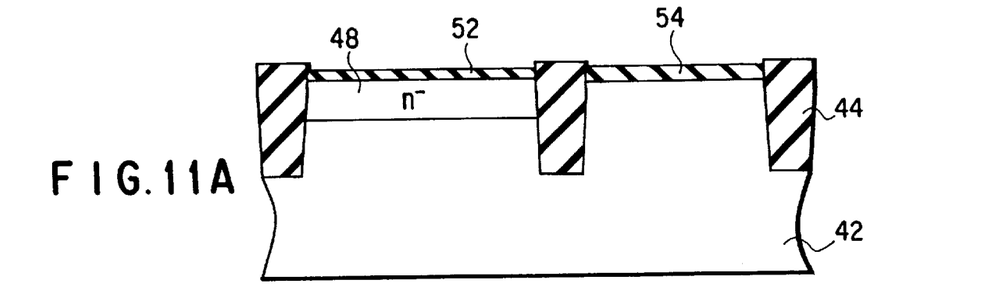
FIGS. 11A and 11B are cross sectional views for illustrating the method of manufacturing the semiconductor device according to the third embodiment.

Next, as shown in FIG. 11A, a silicon oxide film with a film thickness of 6 nm is formed on the semiconductor substrate 42 by the thermal oxidation method. As a result, a gate insulating film 52 formed of the silicon oxide film with the film thickness of 6 nm is formed on the left element region in which the internal circuit is to be formed, and at the same time, a gate insulating film 54 formed of the silicon oxide film with the film thickness of 9 nm is formed on the right element region in which the peripheral circuit is to be formed.

Figure 11B:
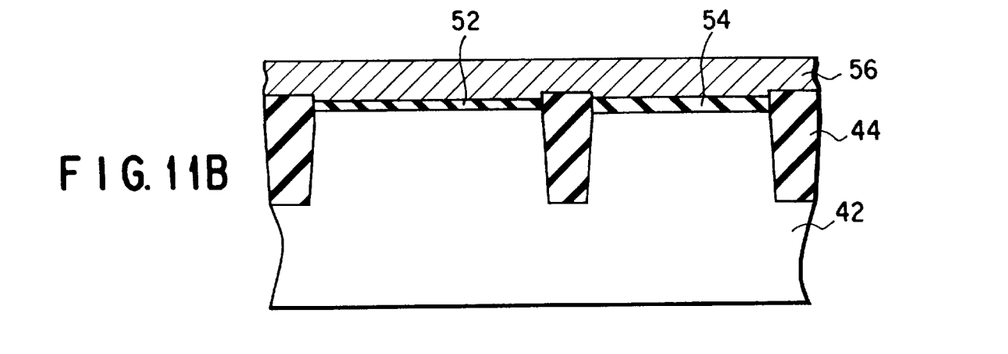
Figure 12:
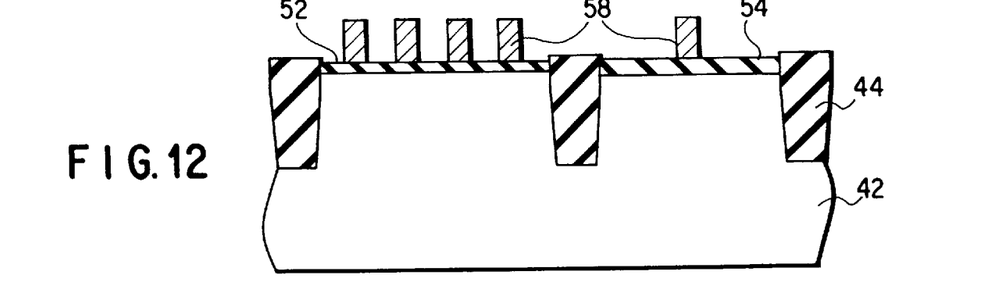
FIG. 12 is a cross sectional view for illustrating the method of manufacturing the semiconductor device according to the third embodiment.

After this, as shown in FIG. 11B, a polysilicon film 56 is deposited, a resist pattern (not shown) is formed on the polysilicon film 56, and impurity is doped into the polysilicon film 56 with the resist pattern used as a mask. Further, by using the same resist pattern as a mask, the well ion-implantation and channel ion-implantation are adequately effected into the semiconductor substrate 42 via the polysilicon film 56. In the above process, the doping into the gate electrode film (polysilicon film 56), well ion-implantation, and channel ion-implantation can be effected by using the same mask and the number of steps can be reduced. Further, as shown in FIG. 12, the polysilicon film 56 is patterned by the photolithography technology to form gate electrodes 58 on both of the element regions. After this, like the above embodiment, the process is effected according to the normal MOS-FET manufacturing process.

In this embodiment using the anodic oxidation method, the region in which the thin silicon oxide film is formed is not necessarily made as the n-type region in the last stage and it is possible to convert the conductivity type thereof by doping impurity into the well or channel region.

As described above, according to the third embodiment, a region in which the growth rate of the silicon oxide film is desired to be made low is changed to an n-type region by doping and the anodic oxidation is effected in the dark atmosphere to form a silicon oxide film with a film thickness corresponding to the difference in the film thickness and then the thermal oxidation method is effected to form the silicon oxide film so as to form silicon oxide films with two different film thicknesses while the number of photolithography steps for forming the resist patterns is reduced in comparison with the conventional complicated process consisting of the thermal oxidation method. Further, the film quality of the silicon oxide film formed by the anodic oxidation method can be improved by using the heat treatment process by use of the thermal oxidation method and the TDDB (Time Dependent Dielectric Breakdown) characteristic can be improved.

[Fourth Embodiment]

Next, a fourth embodiment of the present invention is explained.

The fourth embodiment is a modification of the second embodiment and relates to a method of manufacturing a semiconductor device in which silicon oxide films with two or more film thicknesses are formed by use of the anodic oxidation method after element ions for changing the growth rate of the silicon oxide film are doped.

Figure 13:
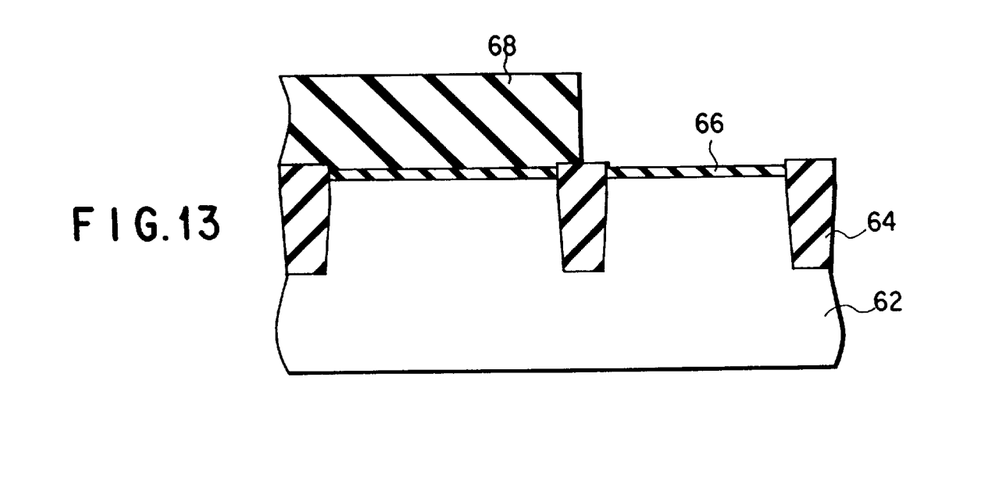
FIG. 13 is a cross sectional view for illustrating a method of manufacturing a semiconductor device according to a fourth embodiment.
Figure 14A:
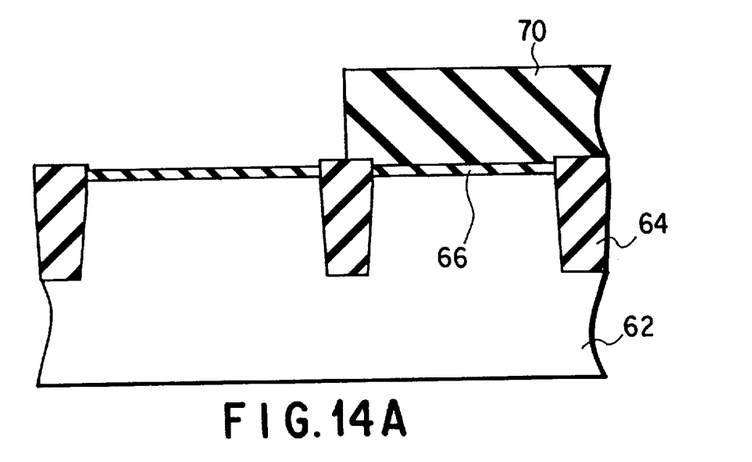
FIGS. 14A and 14B are cross sectional views for illustrating the method of manufacturing the semiconductor device according to the fourth embodiment.
Figure 14B:
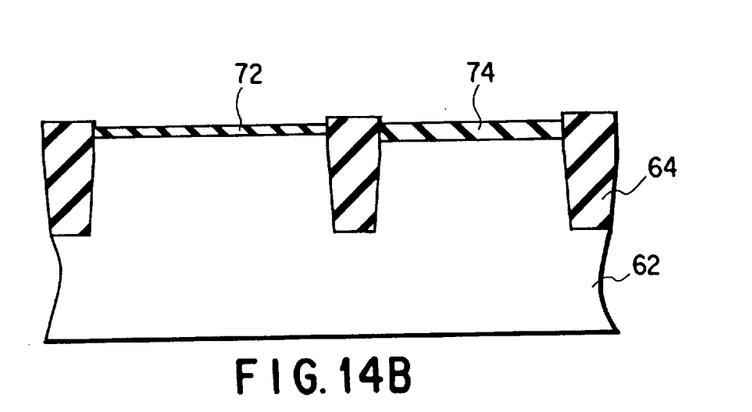
Figure 15:
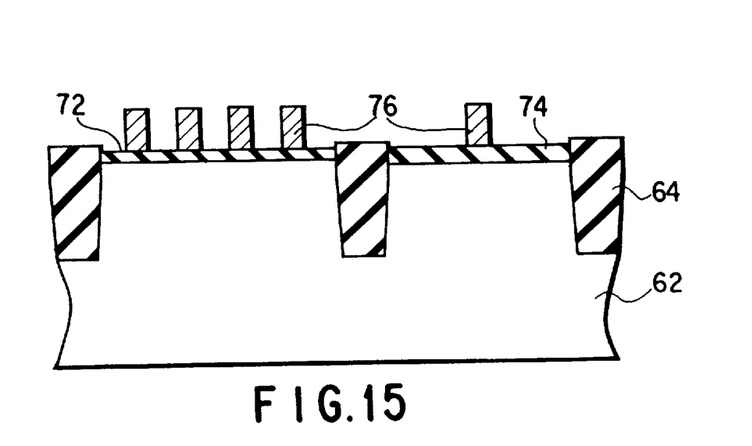
FIG. 15 is a cross sectional view for illustrating the method of manufacturing the semiconductor device according to fourth embodiment.

FIGS. 13 to 15 are cross sectional views for illustrating the method of manufacturing the semiconductor device according to the fourth embodiment.

First, like the second embodiment, as shown in FIG. 13, a field oxide film 64 used as an element isolation region is formed on a semiconductor substrate 62. Next, a buffer oxide film 66 is formed on the entire surface of the semiconductor substrate 62. Like the above embodiment, an example wherein STI is used for formation of the element isolation region is shown, but it is also possible to use the LOCOS method which is conventionally used. Further, it is assumed that an internal circuit is to be formed in the left element region and a gate insulating film with a small film thickness, for example, 6 nm is formed. On the other hand, it is assumed that a peripheral circuit used as an interface with the exterior is formed in the right element region and a gate insulating film with a large film thickness, for example, 9 nm which is thicker than that on the left element region is formed.

Next, as shown in FIG. 13, a resist film is patterned by the photolithography technology to remove the resist film on the right element region and form a resist pattern 68 only on the left element region. Next, the channel ion-implantation for giving the element characteristic to the peripheral circuit is effected in the opened right element region, that is, a region in which the peripheral circuit is to be formed. In the channel ion-implantation, boron (B) is ion-implanted with the dose amount of approx. $1.5 \times 10^{13}$ [cm$^{-2}$]. In the case of p-type MOS-FET, for example, phosphorus (P) is ion-implanted with the dose amount of approx. $1.5 \times 10^{13}$ [cm$^{-2}$].

Since the right element region is a region on which a gate insulating film, that is, a silicon oxide film is formed thick, ions of an element such as argon (Ar) or xenon (Xe) for enhancing the growth rate of the silicon oxide film are doped into the surface area of the semiconductor substrate 62 on the right element region with the resist pattern 68 used as a mask.

Next, as shown in FIG. 14A, the resist pattern 68 is etched and a resist film is coated again by the photolithography technology and patterned to remove the resist film on the left element region and form a resist pattern 70 only on the right element region. Next, the channel ion-implantation for giving the element characteristic to the internal circuit is effected in the opened left element region, that is, a region in which the internal circuit is to be formed. In the channel ion-implantation, boron (B) is ion-implanted with the dose amount of approx. $2.0 \times 10^{13}$ [cm$^{-2}$]. In the case of p-type MOS-FET, for example, phosphorus (P) is ion-implanted with the dose amount of approx. $2.0 \times 10^{13}$ [cm$^{-2}$].

Since the left element region is a region on which a gate insulating film, that is, a silicon oxide film is formed thin, ions of an element such as antimony (Sb) or gallium (Ga) for lowering the growth rate of the silicon oxide film are doped into the surface area of the semiconductor substrate 62 on the left element region with the resist pattern 70 used as a mask.

As shown in FIG. 14B, after the buffer oxide film 66 on the semiconductor substrate 62 is etched, the anodic oxidation is effected to form a silicon oxide film with a film thickness of 6 nm on the left element region in which the internal circuit is to be formed and the silicon oxide film is used as a gate insulating film 72. At the same time, a silicon oxide film with a film thickness of 9 nm is formed on the right element region in which the peripheral circuit is to be formed and the silicon oxide film is used as a gate insulating film 74. In the anodic oxidation, like the second embodiment, for example, a wafer containing the semiconductor substrate 62 is dipped together with an electrode into an HCl solution of 0.1 M or a solution of NH$_4$OH:H$_2$O of 1:10 and a predetermined current is caused to flow between them to form a silicon oxide film.

At this time, as described before, since element ions for lowering the growth rate of the silicon oxide film are doped into the left element region in which the internal circuit is to be formed and element ions for enhancing the growth rate of the silicon oxide film are doped into the right element region in which the peripheral circuit is to be formed, gate insulating films 72 and 74 respectively having film thicknesses of 6 nm and 9 nm can be simultaneously formed on the left and right element regions by adjusting the dose amounts of the element ions doped into the left and right element regions and setting the ratio of the growth rates to ⅔.

In this example, element ions for lowering and enhancing the growth rates of the silicon oxide films are respectively doped into the left and right regions, but element ions for enhancing the growth rate of the silicon oxide film may simply be doped into the right element region in which the peripheral circuit is to be formed so as to set the ratio of the growth rates to ⅔. Further, element ions for lowering the growth rate of the silicon oxide film may only be doped into the left element region in which the internal circuit is to be formed so as to set the ratio of the growth rates to ⅔.

After this, as shown in FIG. 15, a polysilicon film adequately doped with impurity is deposited and then the polysilicon film is patterned by the photolithography technology to form gate electrodes 76 on both of the element regions. After this, the process is effected according to the normal MOS-FET manufacturing process.

As described above, according to the fourth embodiment, since the channel ion-implantation and the ion-implantation for changing the growth rate of the silicon oxide film can be continuously effected by use of the same mask pattern, the silicon oxide films with two different film thicknesses can be formed while the number of photolithography steps for forming the resist patterns is reduced in comparison with the conventional complicated process.

In the above embodiment, a method of forming the silicon oxide films with two different film thicknesses is explained, but the present manufacturing method is not limited to formation of the silicon oxide films with two different film thicknesses and can be applied to a case wherein silicon oxide films with three or more different film thicknesses are formed. Further, as a material for the resist pattern, any material which prevents element ions to be doped from being transmitted therethrough can be used and a silicon nitride film or other films different from the resist film may be used. Further, impurity in the channel region is not limited to boron (B) or phosphorus (P), and indium (In) can be used as p-type impurity and arsenic (As) or antimony (Sb) can be used as n-type impurity.

As described above, according to the present invention, in a method of manufacturing a semiconductor device using MIS-FETs having gate insulating films with two or more different film thicknesses on the same semiconductor substrate, a method of manufacturing the semiconductor device in which the manufacturing efficiency can be enhanced and the manufacturing cost can be lowered while the number of photolithography steps for forming the mask patterns can be reduced in comparison with a conventional process for forming gate insulating films with two or more different film thicknesses by forming a gate insulating film with a film thickness corresponding to a difference in the film thickness between the gate insulating films on part of the region on the semiconductor substrate by use of a mask pattern and then forming a gate insulating film on the entire surface of the semiconductor substrate.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device having MIS field effect transistors (MIS-FETs) with gate insulating films of different film thicknesses formed in element regions on the same semiconductor substrate, comprising:

effecting channel ion-implantation with respect to at least one of the element regions in which the MIS-FETs are to be formed;

selectively doping at least one impurity for changing the growth rate of an insulating film into said at least one of the element regions, said at least one impurity including a first impurity composed of electrically inactive ions for enhancing the growth rate of the gate insulated films, the first impurity being doped in a channel portion of a MIS-FET to be formed; and simultaneously forming gate insulating films of different film thicknesses on the element regions which have been subjected to the channel ion-implantation and the doping of impurity.

2. A method according to claim 1, wherein a thermal oxidation method is used when the gate insulating films are formed on the element regions.

3. A method according to claim 1, wherein the first impurity is composed of one of argon (Ar), xenon (Xe) and oxygen ($O_2$).

4. A method according to claim 1, wherein a thermal oxidation method is used when the gate insulating films are formed on the element regions.

5. A method according to claim 1, wherein said at least one impurity includes a second impurity for lowering the growth rate of the gate insulating films.

6. A method according to claim 5, wherein the second impurity is composed of nitrogen ($N_2$) ions which are doped in a dose amount of $1.0 \times 10^{15}$ cm$^{-2}$ or less.

7. A method according to claim 5, wherein a thermal oxidation method is used when the gate insulating films are formed on the element regions.

8. A method according to claim 1, wherein:

the first impurity enhances the growth rate of the gate insulating films; and said at least one impurity further includes a second impurity for lowering the growth rate of the gate insulating films.

9. A method according to claim 8, wherein the first impurity is composed of one of argon (Ar), xenon (Xe) and oxygen ($O_2$) and the second impurity is composed of nitrogen ($N_2$) ions.

10. A method according to claim 8, wherein a thermal oxidation method is used when the gate insulating films are formed on the element regions.

11. A method of manufacturing a semiconductor device having a first MIS-FET with a gate insulating film of first film thickness and a second MIS-FET with a gate insulating film of second film thickness larger than the first film thickness formed on the same semiconductor substrate, comprising:

effecting channel ion-implantation for an element region in which the first MIS-FET is to be formed, by use of a first mask pattern;

effecting channel ion-implantation for an element region in which the second MIS-FET is to be formed and the doping of impurity composed of electrically inactive ions for enhancing the growth rate of the gate insulating film with the second film thickness, by use of a second mask pattern, said impurity being doped in a channel portion of the second MIS-FET to be formed; and simultaneously forming gate insulating films of different film thicknesses on the respective element regions which have been subjected to the channel ion-implantation and the doping of the impurity.

12. A method of manufacturing a semiconductor device having a first MIS-FET with a gate insulating film of first film thickness and a second MIS-FET with a gate insulating film of second film thickness larger than the first film thickness formed on the same semiconductor substrate, comprising:

effecting channel ion-implantation for an element region in which the first MIS-FET is to be formed and the doping of a first impurity for lowering the growth rate of the gate insulating film with the first film thickness, by use of a first mask pattern, the first impurity being doped in a channel portion of the first MIS-FET to be formed;

effecting channel ion-implantation for an element region in which the second MIS-FET is to be formed and the doping of a second impurity composed of electrically inactive ions for enhancing the growth rate of the gate insulating film with the second film thickness, by use of a second mask pattern, the second impurity being doped in a channel portion of the second MIS-FET to be formed; and simultaneously forming gate insulating films of different film thicknesses on the respective element regions which have been subjected to the channel ion-implantation and the doping of the impurities.

13. A method of manufacturing a semiconductor device having MIS field effect transistors (MIS-FETs) with gate insulating films of different film thicknesses formed on the same semiconductor substrate, comprising:

selectively doping a first impurity composed of electrically inactive ions for enhancing the growth rate of the gate insulated films into an element region in which the gate insulating film is to be formed thick and which is contained in element regions in which the MIS-FETs are to be formed, the first impurity being doped in a channel portion of a MIS-FETS to be formed; or selectively doping a second impurity into an element region in which the gate insulating film is to be formed thin and which is contained in element regions in which the MIS-FETs are to be formed, the second impurity being doped in a channel portion of a MIS-FET to be formed; and simultaneously forming gate insulating films of different film thicknesses on the respective element regions which have been doped with the impurity, by use of an anodic oxidation method.

14. A method according to claim 13, wherein:

n-type impurity is doped into a first element region on which a silicon oxide film of a first film thickness is to be formed and which is contained in the element regions in which the MIS-FETs are to be formed in order to form an n⁻ region;

the anodic oxidation is effected in a dark atmosphere without applying light to the semiconductor substrate and a silicon oxide film is formed on a second element region on which a silicon oxide film of a second film thickness larger than the first film thickness is to be formed and which is contained in the element regions in which the MIS-FETs are to be formed; and after the anodic oxidation in the dark atmosphere, light is applied to the semiconductor substrate and the anodic oxidation is effected to form silicon oxide films on the first and second element regions.

15. A method according to claim 13, wherein:

n-type impurity is doped into a first element region on which a silicon oxide film of a first film thickness is to be formed and which is contained in the element regions in which the MIS-FETs are to be formed in order to form an n⁻ region;

the anodic oxidation is effected in a dark atmosphere without applying light to the semiconductor substrate and a silicon oxide film is formed on a second element region on which a silicon oxide film of a second film thickness larger than the first film thickness is to be formed and which is contained in the element regions in which the MIS-FETs are to be formed; and after the anodic oxidation, silicon oxide films are further formed on the first and second element regions by use of a thermal oxidation method.

16. A method according to claim 13, wherein:

ions of one of argon (Ar) and xenon (Xe) are doped into an element region on which a silicon oxide film as the gate insulating film is to be formed thick and which is contained in the element regions in which the MIS-FETs are to be formed; and a silicon oxide film is formed on the element region in which the ions have been doped, by use of the anodic oxidation method.

17. A method according to claim 13, wherein:

ions of one of antimony (Sb) and gallium (Ga) are doped into an element region on which a silicon oxide film as the gate insulating film is to be formed thin and which is contained in the element regions in which the MIS-FETs are to be formed; and a silicon oxide film is formed on the element region in which the ions have been doped, by use of the anodic oxidation method.

18. A method according to claim 13, wherein:

ions of one of antimony (Sb) and gallium (Ga) are doped into a first element region on which a silicon oxide film of a first film thickness is to be formed and which is contained in the element regions in which the MIS-FETs are to be formed;

ions of one of argon (Ar) and xenon (Xe) are doped into a second element region on which a silicon oxide film of a second film thickness larger than the first film thickness is to be formed and which is contained in the element regions in which the MIS-FETs are to be formed; and silicon oxide films are formed on the first and second element regions by use of the anodic oxidation method.

* * * * *